United States Patent
Miller et al.

(10) Patent No.: US 6,845,249 B1
(45) Date of Patent: Jan. 18, 2005

(54) ANALOG TEST OUTPUT SWITCHABLY CONNECTED TO PCMCIA CONNECTOR PIN

(75) Inventors: Bruce Michael Miller, North Vancouver (CA); Trent Owen McKeen, Coquitlam (CA)

(73) Assignee: Sierra Wireless, Inc., Richmond ( * ) Notice: Subject to any disclaimer, the term of this patent is extended or adjusted under 35 U.S.C. 154(b) by 0 days.

(21) Appl. No.: 09/317,259

(22) Filed: May 24, 1999

(51) Int. Cl.[7] .............................................. H04M 1/00
(52) U.S. Cl. .................... 455/556.1; 455/557; 455/558; 709/250; 235/492
(58) Field of Search .................... 455/66, 575, 67.1, 455/67.4, 558, 557, 556.1, 553.1, 552.1; 709/250; 710/62, 301, 100, 14, 63; 324/761, 538, 76.47, 76.55; 235/492, 451

(56) References Cited

U.S. PATENT DOCUMENTS

| | | | | |
|---|---|---|---|---|
| 5,212,373 A | * | 5/1993 | Fujioka et al. .............. 235/492 |
| 5,479,480 A | * | 12/1995 | Scott .......................... 455/425 |
| 5,594,952 A | * | 1/1997 | Virtuoso et al. ............ 455/557 |
| 5,614,818 A | | 3/1997 | Ayat et al. |
| 5,617,449 A | * | 4/1997 | Tanaka ....................... 375/222 |
| 5,689,821 A | * | 11/1997 | Shimazaki .................. 708/109 |
| 5,691,926 A | | 11/1997 | Cannon et al. |
| 5,764,693 A | * | 6/1998 | Taylor et al. ............... 375/222 |
| 5,778,195 A | * | 7/1998 | Gochi ......................... 710/301 |
| 5,793,989 A | * | 8/1998 | Moss et al. ................. 710/105 |
| 5,799,036 A | * | 8/1998 | Staples ....................... 375/222 |
| 5,831,351 A | * | 11/1998 | Khosrowpour et al. .... 307/139 |
| 5,884,190 A | * | 3/1999 | Lintula et al. .............. 455/557 |
| 5,978,036 A | * | 11/1999 | Higa et al. .................. 348/468 |
| 6,169,884 B1 | * | 1/2001 | Funk .......................... 455/67.1 |
| 6,202,109 B1 | * | 3/2001 | Salo et al. .................. 710/301 |
| 6,516,204 B1 | * | 2/2003 | Funk et al. ................. 455/557 |
| 6,546,442 B1 | * | 4/2003 | Davis et al. ................ 710/106 |

FOREIGN PATENT DOCUMENTS

| | | | |
|---|---|---|---|
| JP | 408287006 | * | 11/1996 |
| JP | 409204507 | * | 8/1997 |
| JP | 11 262058 A | | 12/1999 |
| WO | WO 95/34958 A1 | * | 12/1995 |

OTHER PUBLICATIONS

Driver Lockout circuit, IBM Technical Disclosure Bulletin, Dec. 1, 1984, vol. 27, Issue No. 7A, pp. 3850–3851.*
Patent Abstracts of Japan, vol. 1999, No. 14, Dec. 22, 1999.

* cited by examiner

*Primary Examiner*—Charles Appiah
(74) *Attorney, Agent, or Firm*—Thelen Reid & Priest, LLP

(57) ABSTRACT

A PCMCIA modem card uses a switch to output an analog baseband radio signal across a PCMCIA connector pin normally used to output a conventional digital signal. In this way, the analog signal can be accessed to test the radio receiver of the PCMCIA modem card.

26 Claims, 2 Drawing Sheets

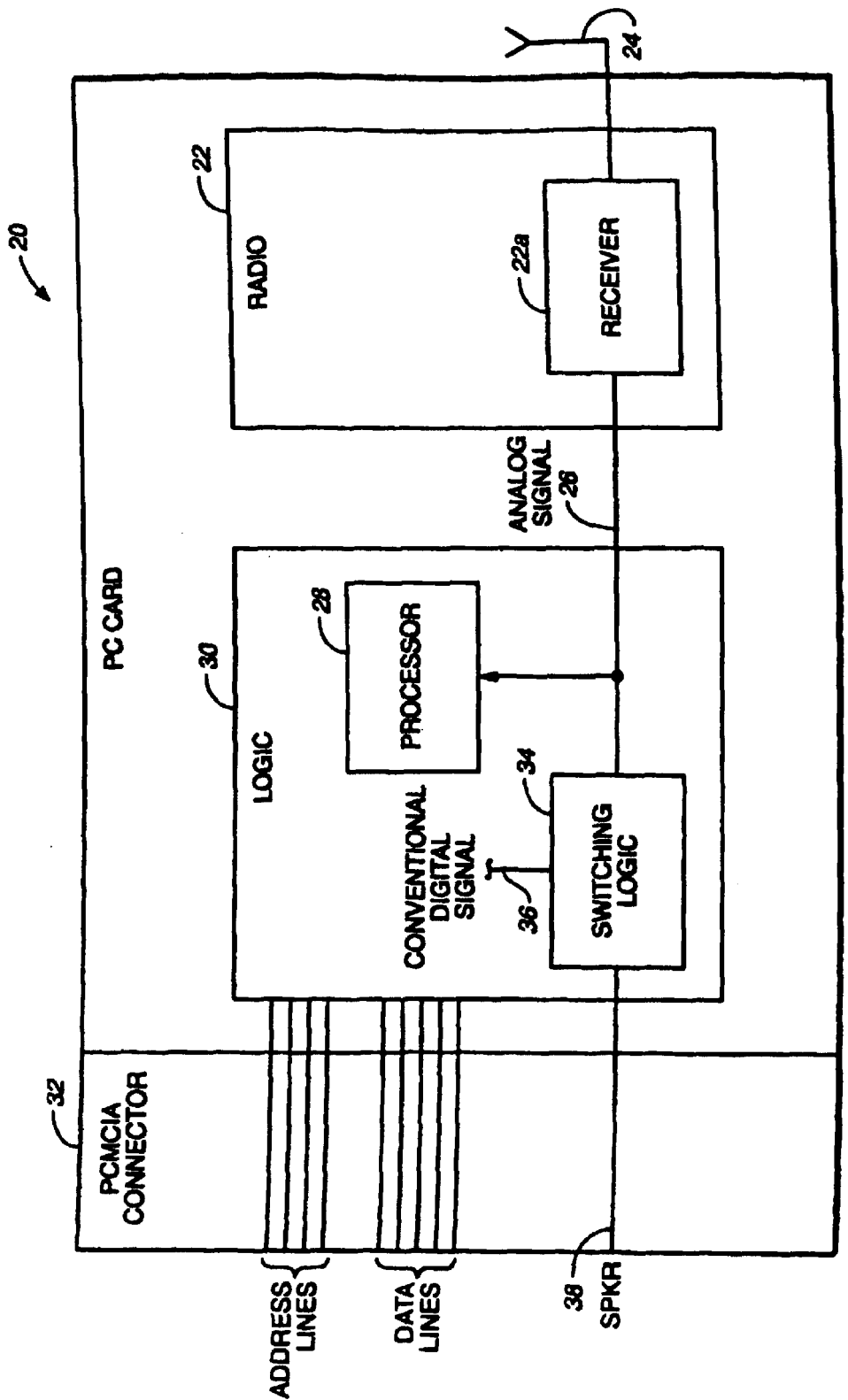
FIG._1

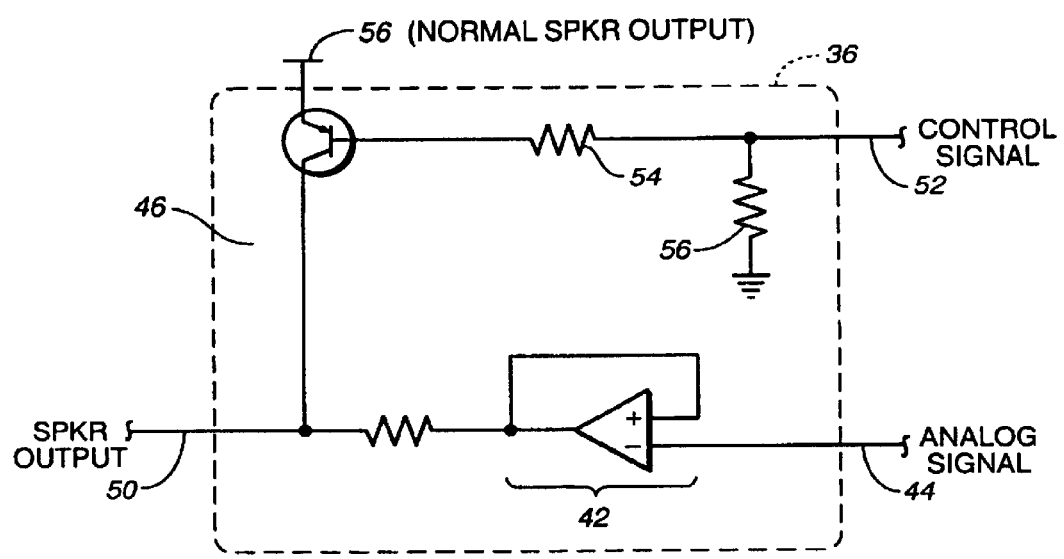
FIG._2

ANALOG TEST OUTPUT SWITCHABLY CONNECTED TO PCMCIA CONNECTOR PIN

BACKGROUND OF THE INVENTION

1. Field of the Invention

The present invention relates to personal computer (PC) cards, and particularly to the testing of PCMCIA modem cards.

2. Brief Description of the Related Art

PC cards are a common way to connect devices to a personal computer. Elements such as memory or communication devices can be placed on a PC card having a standard interface with a personal computer. A popular interface standard for PC cards is the Personal Computer Memory Card Interface Association (PCMCIA) standard. PCMCIA cards come in multiple form factors including, in order increasing thickness, type I, type II, and type III cards. The PCMCIA connector is described in the PCMCIA specification.

The development of personal computing has resulted in an increased demand for wireless modems. The PCMCIA formats have proven to be popular for wireless modems. Typically a radio converts an input radio frequency signal to an analog baseband signal which is sent to a processor. This analog baseband signal is converted to digital data in the processor. The digital data is then output across the PCMCIA connector to the host device.

It is desirable to have access to the analog baseband signal in order to test the operation of the radio receiver. An internal test point can be used, but, it can be relatively difficult to access such an internal test point. Furthermore, it is impossible to access an internal test point after the PCMCIA modem card is packaged.

Alternately, the processor in the card could be used to measure the quality or level of the analog baseband signal. The processor on the card will typically not be as accurate as a dedicated test unit. Additionally, when a failure occurs, the technician must determine whether the failure is due to the radio or the processor.

A separate test port can be used to bring out the analog baseband signal. This results in an added cost for the extra connector and requires an additional hole at the surface of the package. Because of the size of the PCMCIA card, surface space is at a premium.

It is desired to have an improved method to output the analog baseband signal for testing.

SUMMARY OF THE PRESENT INVENTION

The present invention generally concerns a system and method of selectively switching the analog baseband signal rather than a conventional digital signal out of one of the pins of the PCMCIA connector on a PCMCIA card.

Bringing the analog baseband signal out through the PCMCIA connector allows the radio receiver to be calibrated and tested without requiring an internal test probe. This reduces the testing time and allows a packaged PCMCIA card to be tested. Additionally, putting the analog signal out through the PCMCIA connector allows for easier troubleshooting and field diagnosis.

The SPKR pin of the PCMCIA connector can be used. A switch can be adapted to output a conventional digital signal to the SPKR pin most of the time. This is important upon startup when the host system may check the operation of the PCMCIA connector. The switch can later output the analog baseband signal for testing. Control signals from the host system can be used to control the switch. One type of conventional digital signal is a logical "high", such as a 5 volt signal, which can be output through the SPKR pin in normal operation.

In one embodiment, the analog signal can be routed to a host system speaker through the SPKR pin of the connector. By listening to the speaker, the user may be able to make some judgements about the quality of the signal without any external test equipment at all. This may be especially useful when an analog system such as the analog mobile phone system (AMPS) is used.

BRIEF DESCRIPTIONS OF THE DRAWINGS

FIG. 1 is a diagram of a modem card illustrating one embodiment of the present invention.

FIG. 2 is a diagram illustrating one embodiment of a switch which can be used with the system of the present invention.

DETAILED DESCRIPTION OF THE PREFERRED ENVIRONMENT

FIG. 1 is a diagram of a modem card illustrating one embodiment of the present invention. The PC card 20 is, in a preferred embodiment, a radio modem PC card, such as a cellular digital packet data (CDPD) modem. The PC card 20 includes a radio transceiver 22 with a receiver chain 22a. The radio transceiver 22 receives radio frequency signals with antenna 24. In a preferred embodiment, the received radio frequency signals are in the range 800 to 900 MHz. The receiver chain 22a converts the radio frequency signals to an analog baseband signal on line 26. This analog baseband signal, or discriminator (DISC) signal, in one embodiment is a 19.2 Kbps, gaussian minimum-shift keying (GMSK) signal. This analog signal in other embodiments could be an analog voice signal, V.3x data or signaling tones.

The analog signal is sent to the processor 28 in logic portion 30. Processor 28 may be a digital signal processor (DSP). The processor converts the analog baseband signal into digital data which can be send to the host device across the data lines of the PCMCIA connector 32. In one embodiment, the PCMCIA connector 32 is a sixty eight (68) pin PCMCIA card connector.

Switching logic 34 switches between the analog signal on line 26 and the conventional digital signal on line 36. The output of the switch 34 is sent to a pin 38 of the PCMCIA connector 32. In one embodiment, the SPKR pin is used.

Looking at FIG. 1, the switching logic 34 allows either the analog signal on line 26 or the conventional digital signal on line 36 to be output to the SPKR pin 38. In a preferred embodiment, when the radio is not being tested, the conventional digital signal on line 36 is output. Under the PCMCIA specification the host device expects all of the signals across the PCMCIA connector to be digital signals. The conventional digital signal is preferably a logical "high" signal, such as a 5 volt signal. Switching logic 34 preferably includes a buffer to prevent any noise from the host device affecting the analog signal on line 26. The switching logic 34 also prevents the analog signal from being placed on the speaker line 38 during normal operations.

FIG. 2 is a diagram that illustrates one embodiment of a switch which can be used with the system of the present invention. People skilled in the art will understand that a wide variety of alternate switch designs could be used; the details of the switch of FIG. 2 are not believed to be limiting to the present invention.

In this embodiment, the switch 40 includes a buffer 42 connected to the analog baseband signal on line 44. The buffer 42 prevents noise on the host device and the conventional digital signal, such as a 5 volt signal, from affecting the analog signal on line 44. When transistor 46 is on, the conventional digital signal is sent out through the transistor 46 to SPKR line 50. The conventional digital signal overwhelms the output of the buffer 42. When the transistor 46 is off, the output of the buffer 42 is sent along the SPKR line 50. In a preferred embodiment the control signal at line 52 is used to turn on and off the transistor 46. A bias circuit for the transistor 46 including resistors 54 and 56 is also shown. In one embodiment, when the control signal is low, the transistor 46 turns on and when the control signal is high, the transistor 46 turns off.

In a preferred embodiment, the host computer can send commands to the PC card in order to control the switch to output the analog signal. In a preferred embodiment this is done using the address and data lines of the PCMCIA connector 32.

In a preferred embodiment, the PC card is a cellular digital packet data modem card. The present invention is not limited to this embodiment, however. For example, an analog mobile phone system (AMPS) could receive analog signals that are converted into digital signals to send across the digital PCMCIA connector. These analog signals could be sent across a pin of the PCMCIA connector as described in the present invention to test the analog signal.

One benefit of the present invention for an AMPS system is that the analog signal could be sent to the host system's speaker. Even though the speaker may suffer from a high level of distortion because the analog test signal is interpreted as a digital wave form, the user could make out important signals such ring back, busy, handshaking tones, or voice signals. The user could tell a great deal about the status of an attempted modem connection.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appending claims rather than by the foregoing description, and all changes which come within the meaning and range of equivalents thereof are intended to be embraced herein.

What is claimed is:

1. A card for a personal computer, the card comprising:
   a radio producing an analog signal from a received radio frequency signal;
   a processor adapted to convert the analog signal to digital data;
   a set of one or more data lines for transferring the digital data to the personal computer;
   a connector having a pin for establishing a connection to the personal computer; and
   a switch operably connected to the pin, the switch adapted to selectively output a digital signal distinct from the digital data or an unconverted version of the analog signal to the personal computer via the pin.

2. The card of claim 1, wherein the analog signal is output to the pin to test the PC card.

3. The card of claim 1, wherein the connector is a PCMCIA connector.

4. The card of claim 1, wherein the pin is the SPKR pin.

5. The card of claim 1, wherein the digital signal is a logical high value.

6. The card of claim 5, wherein the digital signal is a 5 volt signal.

7. The card of claim 1, wherein the radio is a radio modem.

8. The card of claim 1, wherein the analog signal is a baseband signal.

9. The card of claim 8, wherein the analog signal is a gaussian minimum shift keying modulated signal.

10. The card of claim 1, wherein the digital data is cellular digital packet data.

11. The card of claim 1, wherein the digital data is digital sound data.

12. The card of claim 1, further comprising a buffer adapted to buffer the analog signal.

13. The card of claim 12, wherein the buffer comprises an op amp.

14. The card of claim 12, wherein the switch includes a transistor which is switched by a control signal, wherein when the transistor is off, the output of the buffer goes to the pin and when the transistor is on, the digital signal goes to the pin.

15. The card of claim 12, wherein the buffer output is connected to a resistor.

16. The card of claim 1, wherein the switch is controlled by a control signal.

17. The card of claim 16, wherein the control signal is set by a command from a host device.

18. A method of operating a card for a personal computer, the card having a set of one or more data lines and a connector, the set and connector being operable to establish signal transfer connections with the personal computer, the method comprising:
   receiving a radio frequency signal;
   producing from the radio frequency signal an analog signal;
   converting the analog signal to digital data;
   switchably outputting a digital signal distinct from the digital data or an unconverted version of the analog signal to the personal computer through said pin of said connector of the card.

19. The method of claim 18, wherein the analog signal is output to test the card.

20. The method of claim 18, wherein the digital signal is output on start up.

21. The method of claim 18, wherein the connector is a PCMCIA connector.

22. The method of claim 18, wherein the pin is the SPKR pin.

23. The method of claim 18, wherein the digital signal is a logical high value.

24. The method of claim 18, wherein the analog signal is a baseband signal.

25. The method of claim 18, wherein the switchably outputting step is controlled by a host device to which the card is connected.

26. A computing device having a connection for a card, the card attached to a data pathway through a connection, the computing device comprising:
   a card, communicatively coupled to the computing device through the connection, the card comprising:
      an analog circuitry producing an analog signal associated with the environment external to the card;
      a processing circuitry communicatively coupled to the analog circuitry, that produces a digital signal associated with the analog signal;

a connection circuitry, communicatively coupled to the data pathway, that transmits a first signal to the data pathway from the card; and a switching circuitry, communicatively coupled to the connection circuitry, the analog circuitry, and the processing circuitry, that selectively outputs the digital signal or the analog signal to the connection circuitry.

* * * * *